United States Patent
Hartman

(10) Patent No.: US 7,382,623 B2
(45) Date of Patent: Jun. 3, 2008

(54) METHOD AND SYSTEM FOR COUPLING A CHASSIS TO A RAIL

(75) Inventor: Corey Hartman, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 420 days.

(21) Appl. No.: 10/992,307

(22) Filed: Nov. 17, 2004

(65) Prior Publication Data

US 2005/0068745 A1    Mar. 31, 2005

Related U.S. Application Data

(63) Continuation-in-part of application No. 10/458,818, filed on Jun. 11, 2003, now Pat. No. 6,930,887.

(51) Int. Cl.
*H05K 7/16* (2006.01)
*A47B 88/00* (2006.01)
*A47B 96/00* (2006.01)
*A47F 5/00* (2006.01)

(52) U.S. Cl. .............. 361/726; 312/333; 312/334.46; 211/162; 248/221.11

(58) Field of Classification Search ........ 361/724–727; 312/333, 330.1, 334.46, 223.1, 223.2; 211/4, 211/162; 248/221.12, 221.11
See application file for complete search history.

(56) References Cited

U.S. PATENT DOCUMENTS

| 6,209,979 | B1 |   | 4/2001 | Fall et al. ............... 312/330.1 |
| 6,378,344 | B1 | * | 4/2002 | Gartner .................... 70/278.1 |
| 6,601,933 | B1 | * | 8/2003 | Greenwald ................. 312/333 |
| 2004/0016708 | A1 |   | 1/2004 | Rafferty et al. .............. 211/26 |
| 2004/0079711 | A1 |   | 4/2004 | Hartman et al. ............. 211/26 |
| 2004/0104184 | A1 |   | 6/2004 | Hartman et al. ............. 211/26 |

* cited by examiner

*Primary Examiner*—Jayprakash Gandhi
*Assistant Examiner*—Zachary M Pape
(74) *Attorney, Agent, or Firm*—Hamilton & Terrile, LLP; Robert W. Holland

(57) ABSTRACT

A chassis couples to opposing sliding rails with support posts that align with slots formed in the rails. A retractable plunger aligns with a chassis structure so that insertion of the support posts in the slots compresses the plunger to a retracted position. The chassis slides relative to the rails so that the support posts position under lips of the slots and compression of the plunger is removed. The extended plunger restricts movement of the chassis relative to the rail. A button extending from the plunger allows manual compression of the plunger to allow movement of the chassis relative to the rail for removal of the chassis from the rail.

5 Claims, 8 Drawing Sheets

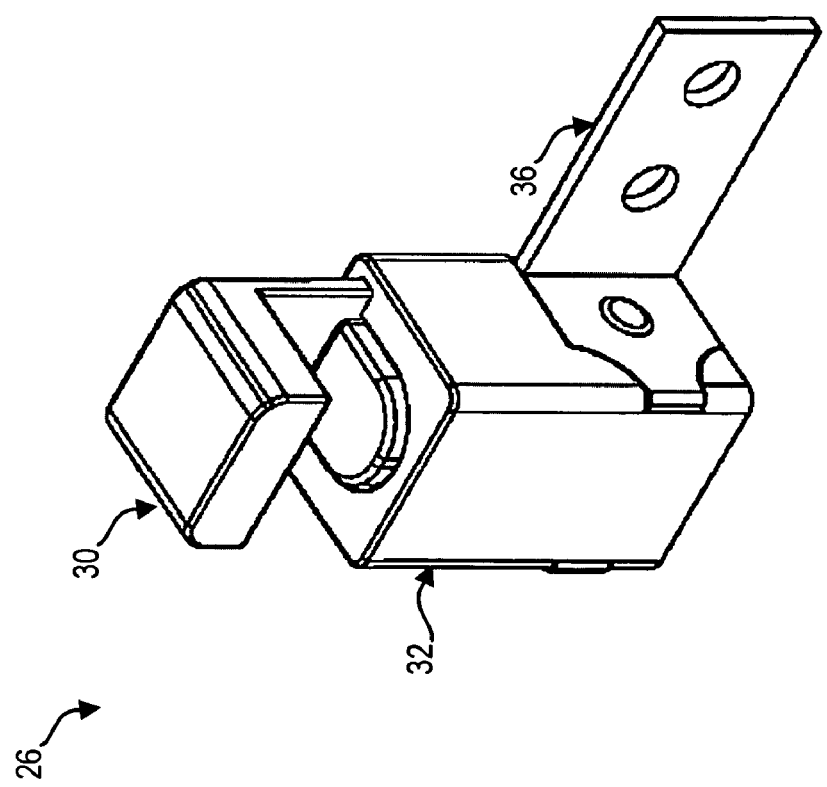

METHOD AND SYSTEM FOR COUPLING A CHASSIS TO A RAIL

RELATED PATENTS

This application is a continuation-in-part of U.S. patent application Ser. No. 10/458,818, entitled "Method and System for Coupling a Chassis to a Rail," naming Corey Hartman as inventor, filed on Jun. 11, 2003 now U.S. Pat. No. 6,930,887 and assigned to Dell Products L.P.

BACKGROUND OF THE INVENTION

1. Field of the Invention

The present invention relates in general to the field of securing a chassis to a rail, and more particularly to a method and system for coupling an information handling system server chassis to a sliding rack rail.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As the amount of information created, handled and stored by businesses increases the number of information handling systems needed by businesses has also increased. Often, businesses concentrate information handling systems in special rooms or confined spaces having limited accessibility. For instance, a server room is often set aside at a central location of a business with server information handling systems assembled in equipment racks. In order to improve access to individual server components, each server information handling system is typically supported on a set of sliding rails that extend outward from the rack. Information handling system manufacturers generally attempt to fit as much information handling power as practical in a given rack with racks and support rails typically built to standardized sizes. However, as greater numbers of more powerful components are placed in a server rack, obtaining access to the components for replacement or maintenance becomes increasingly difficult. To reduce the difficulty of obtaining access to components, manufacturers have attempted to couple components to rack rails with a variety attachment devices, including post and slot arrangements that are locked in place with screws.

Although screws will securely couple a chassis to a rack rail, the use of tools and small screws around electronic equipment is undesirable due to the danger of electric shock and due to the general need for multiple technicians to secure the post and screws. Manufacturers have thus looked for tool-less attachment devices that do not have removable screws and that allow a chassis to be "drop-and-locked" to a rail for secure attachment of the chassis by a single technician. One difficulty with such tool-less devices for securing an information handling system chassis to server rack rails is that the small available space tends to call for small solutions that are easily overcome or broken with the application of relatively small amounts of force. Thus, users faced with complex mechanisms in reduced space easily break such attachment devices during removal or maintenance of the server information handling system component. Another difficulty is that racks come in a variety of standardized sizes so that different securing solutions are often used for different sized racks, chassis and rails. The use of different solutions tends to increase the confusion of users in the operation of securing devices and thus increases the likelihood of the use of excess force that will result in damage to the securing devices.

SUMMARY OF THE INVENTION

Therefore a need has arisen for a method and system which secures a chassis to a rail with an integrated tool-less and easy-to-use secure attachment device.

A further need exists for a method and system which secures information handling system server components to server rack rails in a simple and uniform manner.

A further need exists for a method and system which actuates to release a chassis from a rail so that actuation of the release occurs distal engagement of the chassis to the rail.

In accordance with the present invention, a method and system are provided which substantially reduce the disadvantages and problems associated with previous methods and systems for securing a chassis to a rail, such as an information handling system server chassis to a server rack rail. A chassis secures to a rail with a securing device that automatically engages to restrict movement of the chassis relative to the rail upon insertion of a support post in a slot of the rail. The chassis is removed from the rails by manual operation of the securing device to permit movement of the chassis relative to the rail.

More specifically, the securing device comprises a retractable button mechanism coupled to a rail end and a block coupled to the chassis. The block and button align so that the block compresses the button when securing posts that are coupled to the chassis are inserted into slots formed in the rail. The slots are formed to have an opening that accepts the support posts and then extends horizontally along the rail to define a support surface and an upper lip. The support posts are formed to fit in the slot opening and to slide under the upper lip so that the support posts and slots capture the chassis in five translational directions. As the support posts slide under the upper lip, the block and button unalign so that the button extends to interact with the block to capture the chassis in the sixth translational direction by preventing the support posts from sliding from under the upper lip. The chassis is removed from the rail by manual activation to compress the button and allow the support posts to slide from under the upper lip for removal through the slot opening. A plurality of information handling system server components may be stored in a rack having plural opposing rail pairs with each rail having a button mechanism and each component housing having a block aligned with a button.

In an alternative embodiment, the securing device has a release button disposed distal from the engagement point with the chassis so that a user may more easily actuate the securing device to remove the chassis from the rail. A plunger extends at one end to engage a structure of the chassis to prevent movement of the chassis relative to the rail when the support posts rest under the upper lip of the rail slots. A release button couples to the opposing end of the plunger to accept manual activation by a user that retracts the plunger from engagement with the chassis structure and thus allows movement of the chassis relative to the rail. Location of the release button distal from the engagement point of the plunger with the chassis structure provides a user with ease of access for release of the chassis without having the user's fingers or thumbs interact with the securing device near the point of contact between the securing device and the chassis.

The present invention provides a number of important technical advantages. One example of an important technical advantage is that a chassis is secured to rails with an integrated tool-less attachment device. Tool-less attachment with the securing device allows a single technician to drop a chassis into a secured position with a simple insertion motion of sliding posts under the upper lip. Removal of the chassis is accomplished by manual activation of the securing device and an inverse sliding motion. Both the insertion and removal of the chassis are performed without a need for a technician to alter a supporting grasp on the chassis.

Another example of an important technical advantage of the present invention is that information handling system server components are secured to server rack rails in a simple and uniform manner. Opposing buttons at the rail ends are easily accessible and activated with a simple and intuitive press and slide operation to enable a single technician to add or remove server components to a rack having plural rail pairs for supporting plural components. The button mechanism is sturdy to reduce the risk of breakage from excess force and uniformly applicable across a variety of rack and chassis sizes.

Another example of an important technical advantage of the present invention is that the securing device is connected to the end of the slide that extends from the server rack so that the securing device is easily adapted for use on any type of rack slide, independent of slide geometry, size or manufacturer. In contrast, securing devices that are internal to a slide generally only operate on slides of similar size and geometry and generally do not work on smaller sized slides. The external placement of the securing device supports interchangeable use of the same sized securing device across a variety slide designs independent of actual slide geometry.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 5A and 5B depict assembled and blow-up views of the securing device button.

DETAILED DESCRIPTION

Information handling system server component chassis are secured and released from rack rail pairs with a securing device that automatically restricts movement of the chassis relative to the rail. Manual activation of the securing device allows motion of the chassis relative to the rail to remove the information handling system chassis from the rail. For purposes of this application, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
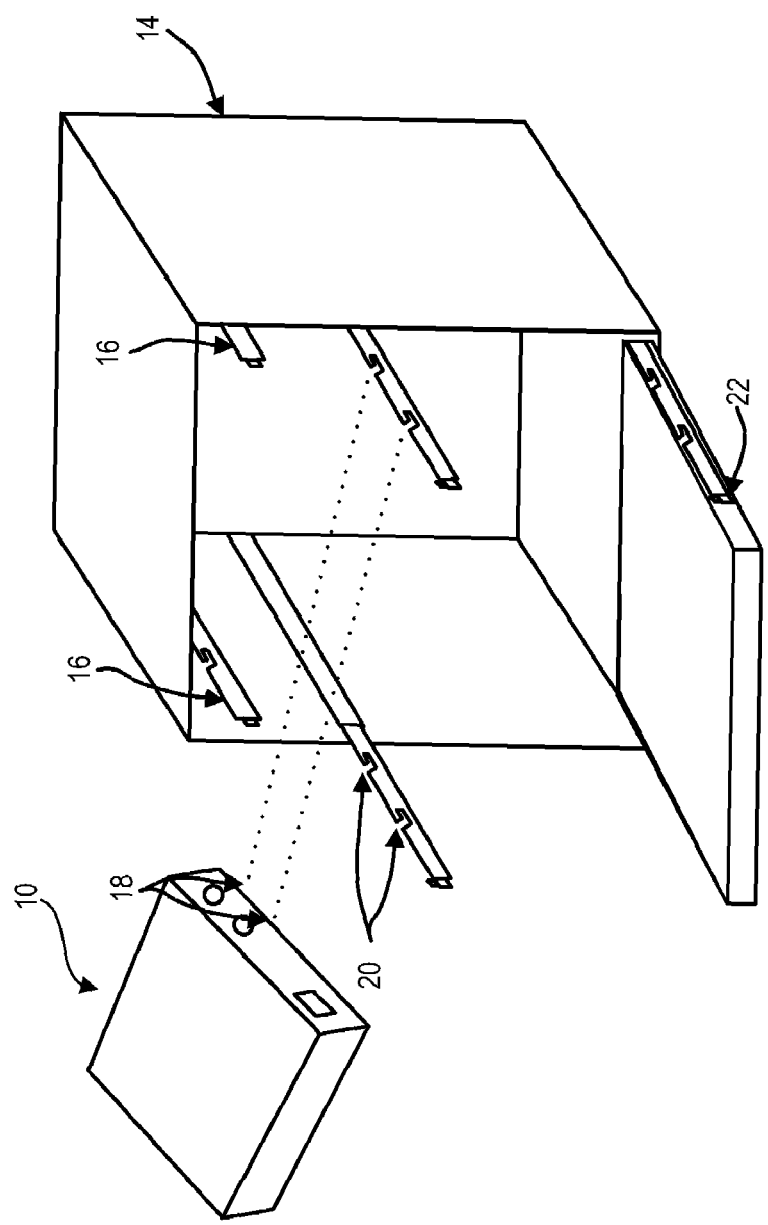
FIG. 1 depicts a server information handling system configured with plural opposing rail pairs having a securing device.

Referring now to FIG. 1, a server information handling system 10 is depicted with plural server component housing chassis 12 supported in a server rack 14 on plural opposing pairs of sliding rails 16. Technicians gain access to information handling system components by sliding a chassis 12 out from rack 14 with sliding rails 16 and removing chassis 12. Information handling system components are safely stored in reduced space by placing the components in plural chassis 12, securing each chassis 12 to an opposing pair of rails 16 and sliding the chassis into server rack 14. Each chassis 12 is secured to an associated opposing pair of rails 16 by support posts 18 that fit in rail slots 20 and a securing device 22 that prevents chassis from inadvertently falling from rack 14 to cause damage to the information handling system components or injury to technicians. Supports posts 18 and slots 20 are formed to restrict motion of chassis 12 relative to rail 16 in five translational directions, and securing device 22 automatically engages upon full insertion of supports posts 18 in slots 20 to restrict motion of chassis 12 relative to rail 16 in the sixth translational direction. Chassis 12 is removed from rails 16 by manual activation of the securing device to release motion of chassis 12 relative to rail 16 in the sixth translation direction and allow chassis 12 to be removed from slots 20.

Figure 2:
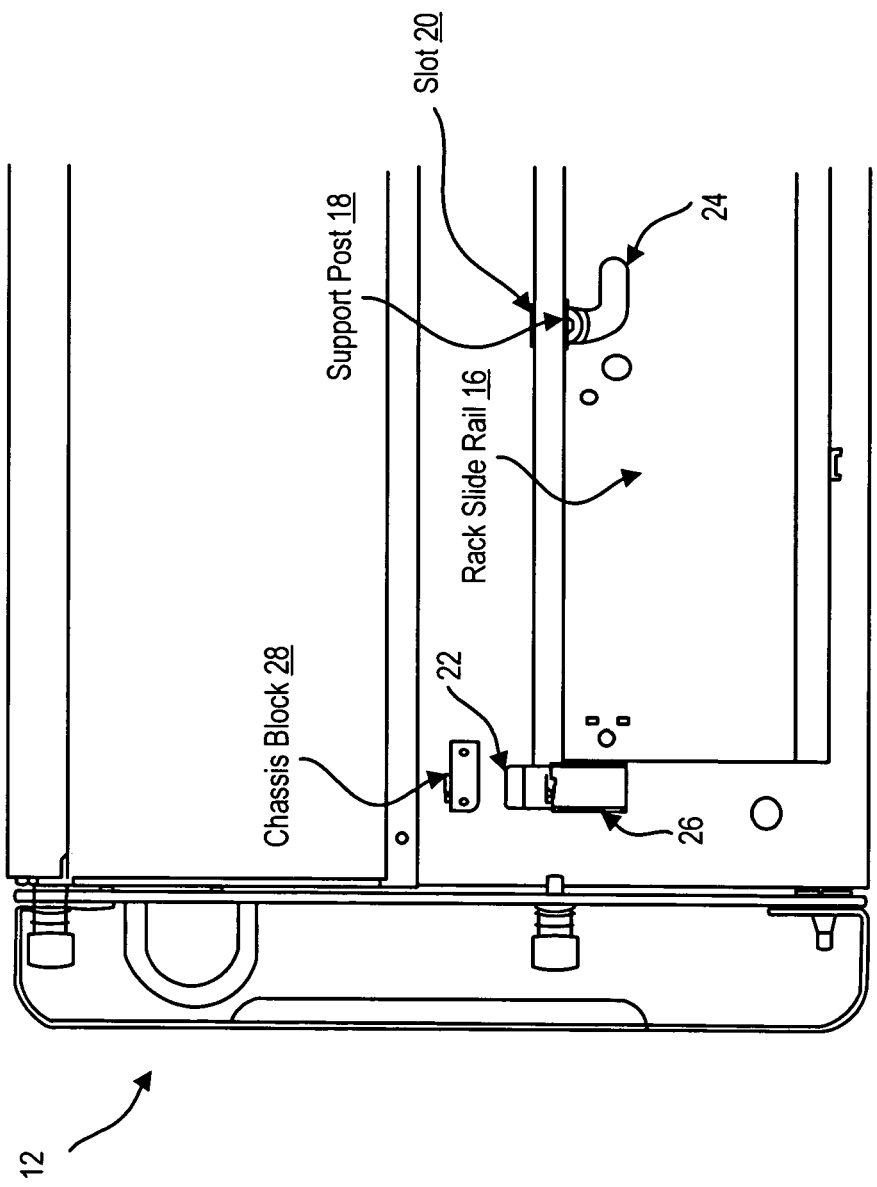
FIG. 2 depicts a side view of insertion of a support post in a rail slot with the securing device button and block aligned.
Figure 3:
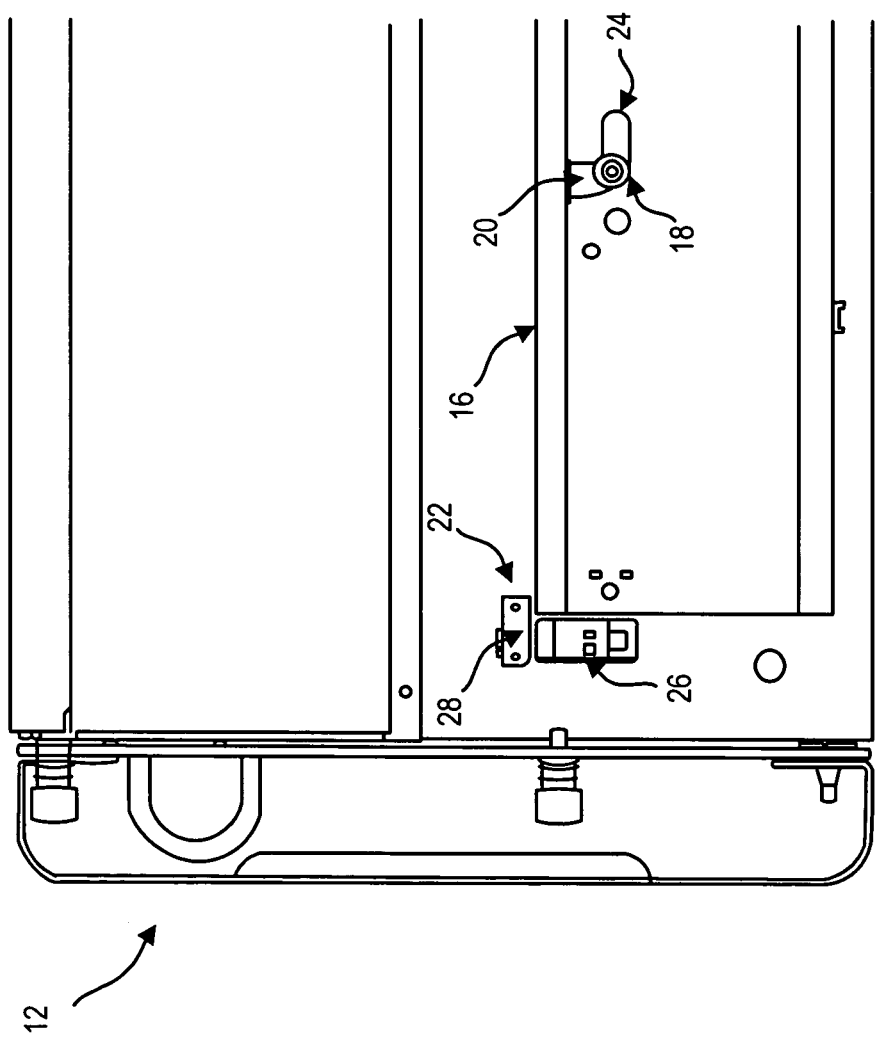
FIG. 3 depicts the securing device button compressed by the chassis block with the support post resting on the support surface in an unsecured position.
Figure 4:
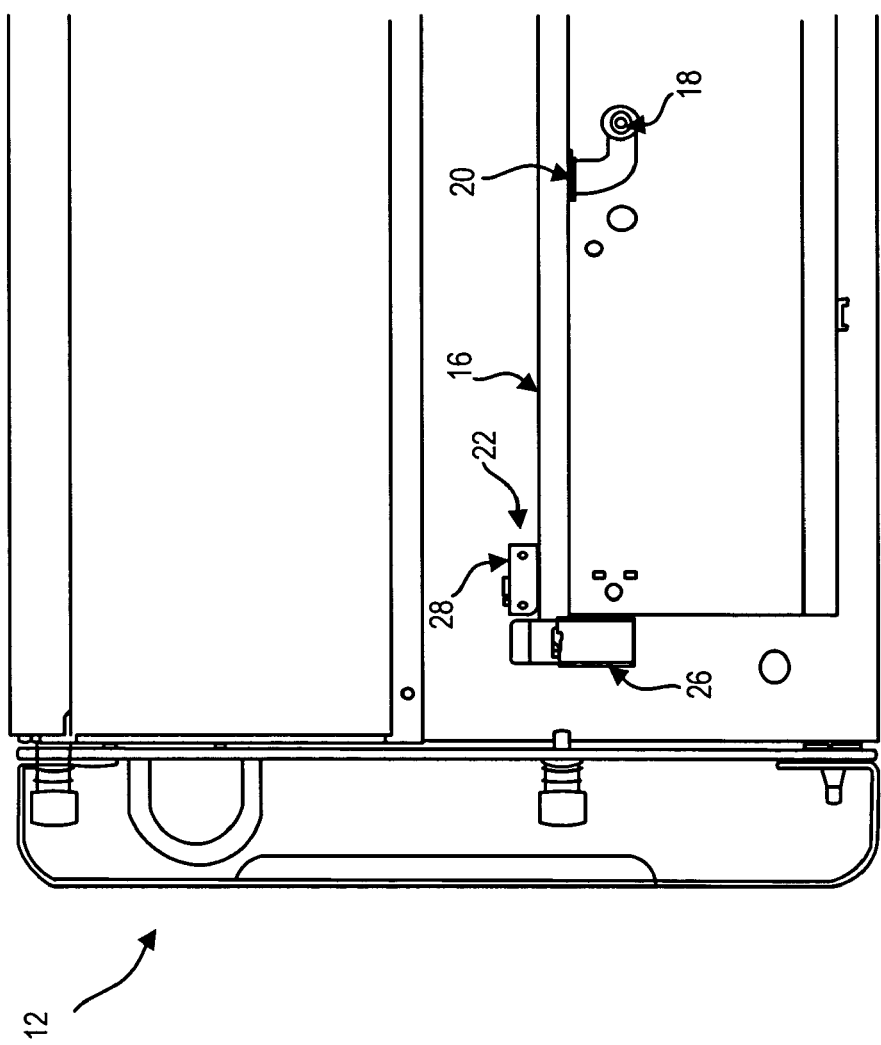
FIG. 4 depicts the support post slid under the slot upper lip to release the securing device button to an extended position that secures the chassis from movement relative to the rail.

Referring now to FIGS. 2, 3 and 4, one embodiment of securing device 22 is depicted securing an information handling system server component chassis housing 12 to a rack slide rail 16. Support post 18 couples to chassis 12 and aligns with slot 20, which is formed with an opening sized to accept insertion of support post 18. For instance, support post 18 is a shoulder screw having an end with a width that fits in the upper opening of slot 20 and having a tapered connection to chassis 12 so the tapered connection of support post 18 fits through the side opening of slot 20 but the wider end of support post 18 does not fit through the side opening and is thus captured by slot 20. Support post 18 drops vertically into the opening of slot 20 and slides horizontally along slot 20 to rest under an upper lip 24 formed in slot 20. Slot 20 and support post 18 are thus shaped to capture chassis 12 in all six translational directions except for horizontal translational movement between a position under the opening of slot 20 and a position under the upper lip 24. Upon insertion of support post 18 into slot 20 and under upper lip 24, securing device 22 secures chassis 12 to rail 16 in the sixth translational direction.

Securing device 22 has a retractable button 26 coupled to the extended end of rail 16 and a chassis block 28 coupled to chassis 12 that interact to control movement of chassis 12 relative to slide 16 in the horizontal translational direction. As support post 18 aligns with and enters the opening of slot 20, block 28 aligns with button 26 so that the bottom surface of block 28 contacts the upper surface of button 26 to place a compressing force button 26. As depicted by FIG. 3, once support post 18 is lowered to contact the bottom support surface of slot 20, block 28 compresses button 26 with the weight of chassis 12 by contact of the bottom surface of block 28 with the upper surface of button 26. However, the position depicted by FIG. 3 is an unsecured position in that chassis 12 is not restricted from removal from rail 16 by lifting support post 18 out of slot 20.

Chassis 12 is secured to rail 16 by sliding chassis 12 horizontally relative to rail 16 so that support post 18 slides under upper lip 24 and securing device 22 engages to restrict movement of chassis 12 relative to rail 16 so that support post 18 remains under upper lip 24. As depicted by FIG. 4, horizontal translational movement of chassis 12 relative to rail 16 removes the upper surface of button 26 from under block 28 to allow button 26 to extend upward so that the side surface of button 26 interacts with the side surface of block 28. The automatic extension of button 26 from the compressed retracted position to the extended position restricts horizontal translational movement of chassis 12 relative to rail 16 with contact of the side surfaces of button 26 and block 28 so that support post 18 remains under upper lip 24 to secure chassis 12 to rail 16. Removal of chassis 12 from rail 16 is accomplished by manual compression of button 26 to allow horizontal translational movement of chassis 12 relative to rail 16 with the upper surface of the compressed button sliding under the lower surface of block 28 until support post 18 aligns with the opening of slot 20. In alternative embodiments, button 26 may be coupled to chassis 12 instead of to rail 16 to interact with a block coupled to rail 16, and may be placed at other locations along the length of rail 16. In order to simplify operation securing device 22, instructions or color coding may be applied to button 26 or chassis 12. Further, the dimensions of securing device 22, slot 20 and support post 18 may be adjusted for variously-sized chassis 12 are rails 16 without substantially altering the operation of the securing device.

Figure 5B:
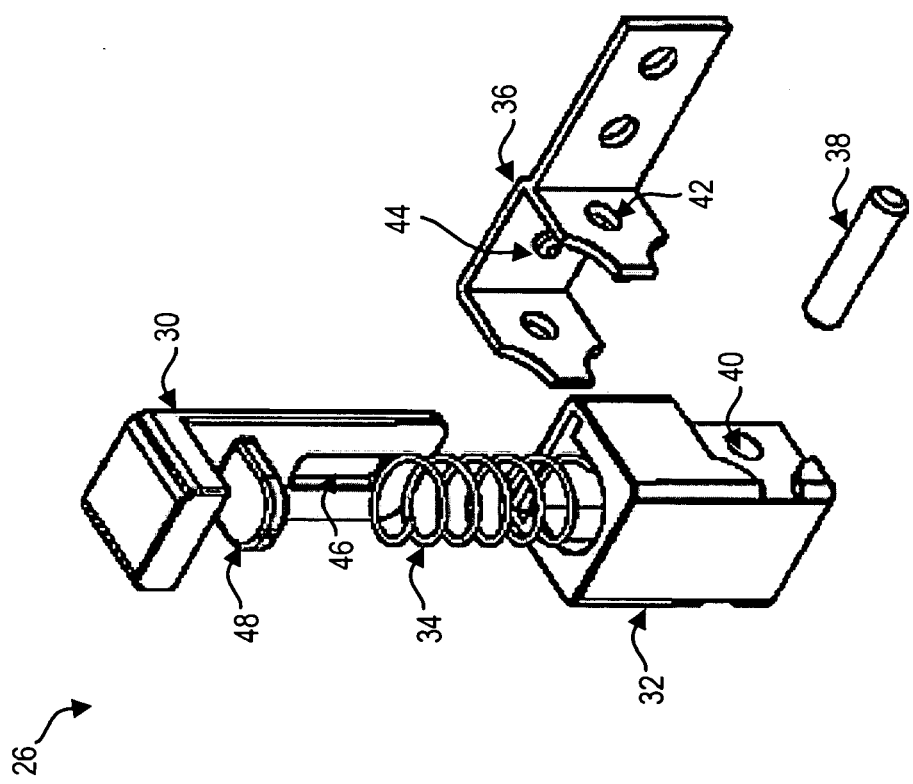

Referring now to FIGS. 5A and 5B, one embodiment of button 26 is depicted assembled and as a blow-up. A plunger 30 forms the upper contact surface of button 26 and inserts in a housing 32 over a spring 34. Housing 32 is sized to fit plunger 30 securely but to allow movement along a vertical axis. Spring 34 biases plunger 30 to an extended position and allows compression of plunger 30 by a compressive force asserted against the upper surface of plunger 30 by a block coupled to a chassis. Housing 32 is coupled to a rail with a bracket 36. A pin 38 holds together the assembled plunger 30, housing 32 and bracket 36 by inserting through an opening 40 in housing 32 and an opening 42 in bracket 36. A guide pin 44 extends from bracket 36 through housing 32 and into a vertical slot 46 formed in plunger 30. Vertical slot 46 defines the motion in the vertical axis along the length of housing 32 that plunger 30 travels. Spring 34 provides the bias for plunger 30 to remain in the extended position by pushing against a spring support 48 that traps spring 34 within housing 32. Bracket 36, plunger 30 and housing 32 are symmetrical about their axes of attachment so that the parts are interchangeable for left or right hand assembly.

Figure 6A:
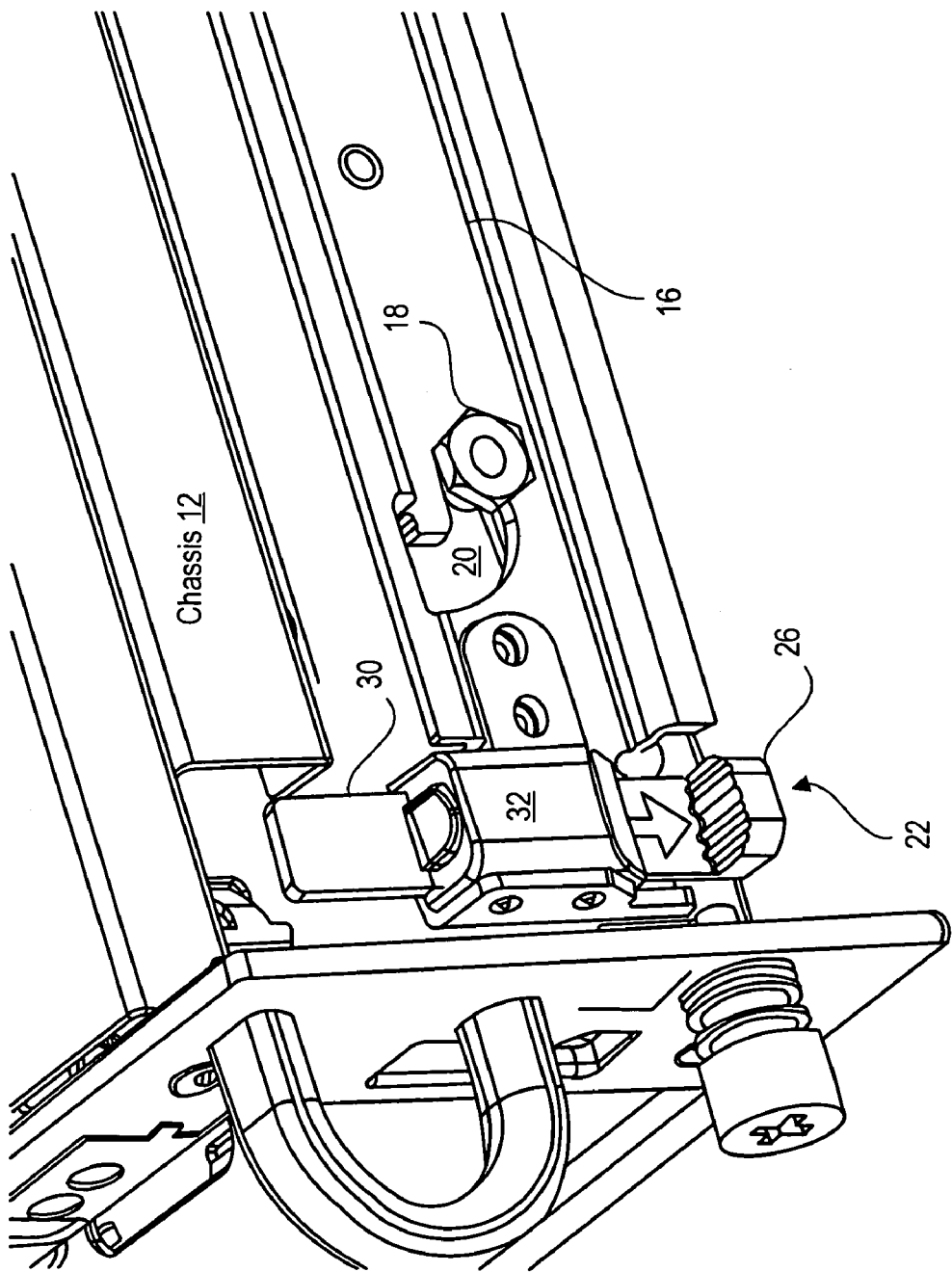
FIGS. 6A and 6B depict assembled and blow-up views of the securing device.

Referring now to FIG. 6A, an alternative embodiment of a securing device 22 is depicted to have a release button 26 separate from a securing portion of plunger 30 that engages chassis 12. Post 18 fits into slot 20 so that a structure extending from chassis 12 compresses the upper portion of plunger 30. Compression of plunger 30 allows post 18 to slide under the lip of slot 20 until, upon release from under the compression of the chassis structure, plunger 30 extends upwards into a position that prevents movement of chassis 12 relative to rail 16 by lateral interaction with the chassis structure. In order to release chassis 12 from rail 16, button 26 is pressed downward to pull the upper portion of plunger 30 into support housing 32. Retraction of plunger 30 into housing 32 allows chassis 12 to slide relative to rail 16 for aligning post 18 with the open portion of slot 20. Having button 26 separate from the upper portion of plunger 30 that interacts with chassis 12 makes user interaction with securing device 22 easier since the user's fingers do not have to shift position as plunger 30 compresses and decompress under the structure of chassis 12. Markings, such as the depicted arrow, indicate to a user the proper placement of thumbs for actuation of button 26.

Figure 6B:
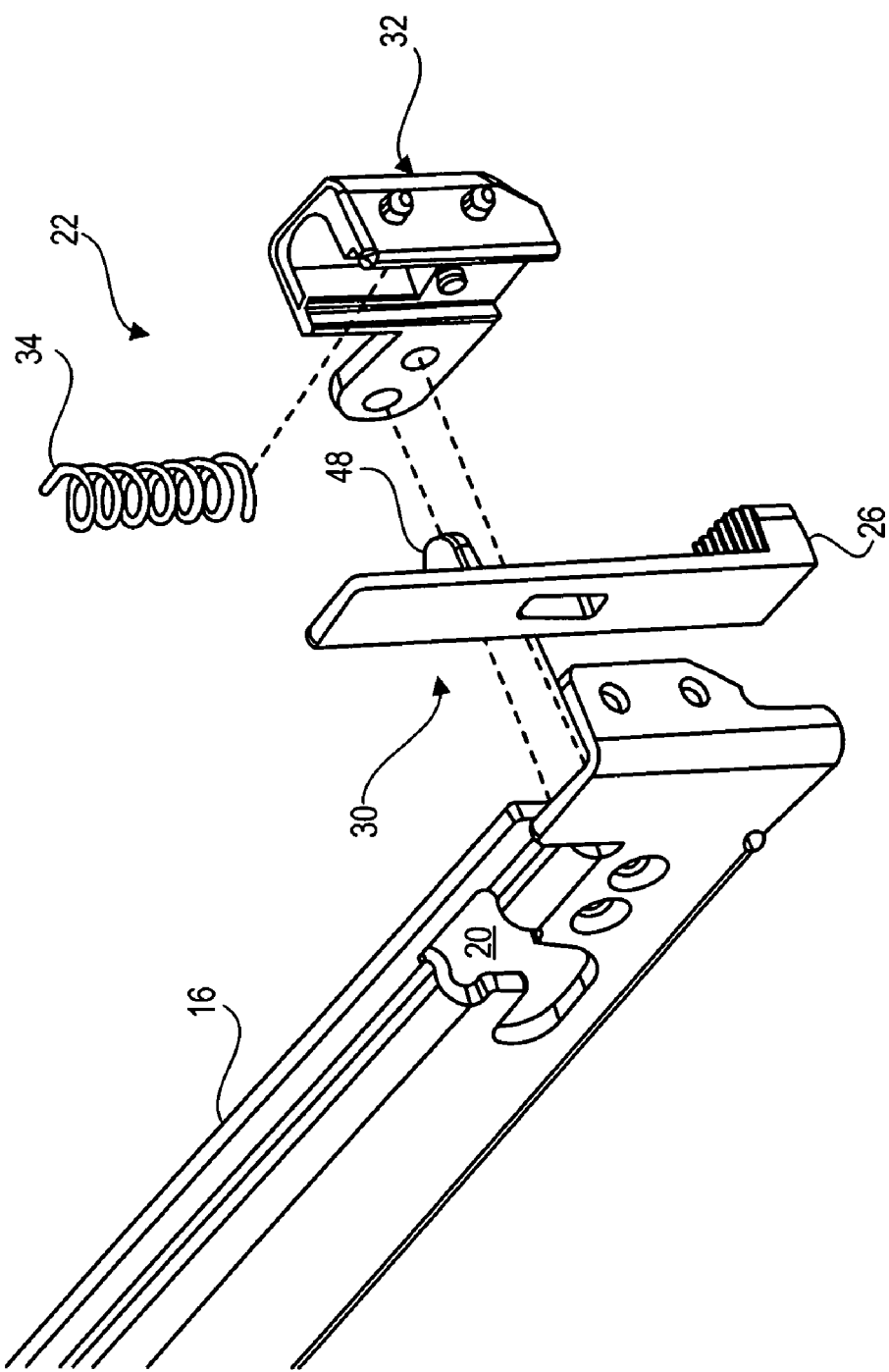

FIG. 6B depicts a blow-up view of the securing device 22 having the securing portion of plunger 30 separate from button 26. Button 26 protrudes from the bottom of housing 32 to be accessible by the thumb or fingers of a user and plunger 30 protrudes from the top of housing 32 to align to engage a chassis. Spring support 48 is disposed mid-length of plunger 30 to define the allowable motion of plunger 30 with interaction along the inner surface of housing 32. Spring 34 fits within the inner surface of housing 32 to engage against spring support 48 and thus bias plunger 30 upwards in position to prevent movement of a chassis relative to rail 16. Housing 32 fits over spring 34 and plunger 30 to secure in position against rail 16 so that plunger 30 moves between a locking position having the upper portion extended upwards by the biasing force of spring 34 and a release position with button 26 depressed downwards from housing 32.

Although the present invention has been described in detail, it should be understood that various changes, substitutions and alterations can be made hereto without departing from the spirit and scope of the invention as defined by the appended claims.

What is claimed is:

1. A method for securing a chassis to a set of opposing support rails, the method comprising:
   aligning support posts extending from the chassis with slots formed in the support rails;
   aligning a retractable plunger coupled to at least one support rail with a structure extending from the chassis;
   inserting the support posts into the slots to compress the retractable plunger by contact of a contact surface of the plunger with the structure;
   sliding the support posts in the slots to a position under a slot lip formed in each slot;
   extending the plunger by removing the plunger from compressed contact with the structure, the extended plunger interacting with the structure to restrict sliding of the support posts from the position under the slot lips; and pressing a button coupled to the plunger distal the contact surface to compress the plunger and allow sliding of the support posts out of the slots.

2. The method of claim 1 further comprising:

removing the support posts from under the slot lips to release the chassis from the rails; and lifting the chassis from the rails.

3. The method of claim 1 wherein the chassis comprises and information handling system housing.

4. The method of claim 1 wherein extending the plunger comprises biasing the plunger to an extended position with a spring.

5. The method of claim 1 wherein the support posts and slots cooperate to restrict motion of the chassis relative to the rails in five translational directions and the extended plunger cooperates with the chassis structure to restrict motion of the chassis relative to the rails in the sixth translational direction.

* * * * *